(12) United States Patent  
Miyagawa

(10) Patent No.: US 7,906,854 B2
(45) Date of Patent: Mar. 15, 2011

(54) SEMICONDUCTOR DEVICE HAVING SPACER FORMED ON SEMICONDUCTOR CHIP CONNECTED WITH WIRE

(75) Inventor: Yuichi Miyagawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 283 days.

(21) Appl. No.: 12/285,752

(22) Filed: Oct. 14, 2008

(65) Prior Publication Data

US 2009/0121327 A1    May 14, 2009

(30) Foreign Application Priority Data

Nov. 8, 2007 (JP) .................................. 2007-290784

(51) Int. Cl.
*H01L 23/48* (2006.01)
(52) U.S. Cl. ......... 257/777; 257/E25.006; 257/E25.013; 257/E25.018; 257/E25.021; 257/E25.027; 257/E23.085
(58) Field of Classification Search ................. 257/777, 257/686, E25.006, E25.013, E25.018, E25.021, 257/E25.027, E23.085; 438/109, FOR. 368, 438/FOR. 426
See application file for complete search history.

(56) References Cited

U.S. PATENT DOCUMENTS

| | | | |
|---|---|---|---|
| 5,323,060 A * | 6/1994 | Fogal et al. | 257/777 |
| 6,943,294 B2 * | 9/2005 | Kang et al. | 174/541 |
| 7,352,068 B2 * | 4/2008 | Kuroda et al. | 257/777 |
| 7,605,476 B2 * | 10/2009 | Gritti | 257/686 |
| 7,692,295 B2 * | 4/2010 | Megahed | 257/728 |
| 2005/0161791 A1 * | 7/2005 | Hortaleza | 257/685 |

FOREIGN PATENT DOCUMENTS

JP         2005-209805         8/2005

* cited by examiner

*Primary Examiner* — Jasmine J Clark
(74) *Attorney, Agent, or Firm* — McGinn IP Law Group, PLLC

(57) ABSTRACT

A semiconductor device includes a semiconductor chip, a supporting body that is disposed below the semiconductor chip and supports the semiconductor chip, a spacer that is fixed onto the first semiconductor chip, and a substrate that is located below the first semiconductor chip and electrically connected to the semiconductor chip with a wire. At least a part of the peripheral portion of the semiconductor chip is an overhang portion that projects more laterally than the peripheral portion of the supporting body. A covering portion that covers a part of the upper surface of the overhang portion is formed in the spacer. The wire is connected to a region in the upper surface of the overhang portion, the region being lateral to the outermost periphery of the covering portion of the spacer and not being covered with the covering portion of the spacer. A height of an apex of the wire from the upper surface of the first semiconductor chip as a reference, is greater than a height, from the reference, of at least a portion in the outermost periphery of the covering portion of the spacer, the portion having the wire arranged at its lateral side.

16 Claims, 9 Drawing Sheets

SEMICONDUCTOR DEVICE HAVING SPACER FORMED ON SEMICONDUCTOR CHIP CONNECTED WITH WIRE

BACKGROUND OF THE INVENTION

1. Field of the Invention

The present invention relates to semiconductor devices.

2. Description of Related Art

Heretofore, with a demand for miniaturization of semiconductor devices, a semiconductor device having multiple semiconductor chips stacked therein has been proposed. For example, Patent Document 1 (Japanese Patent Application Publication No. 2005-209805) discloses a semiconductor device 900 in which a die pad 902, a semiconductor chip 901, a spacer 903, a semiconductor chip 904, and a holding plate 905 are stacked in this order, as shown in FIG. 16.

In this semiconductor device 900, a peripheral portion of the semiconductor chip 904 projects more than a peripheral portion of the spacer 903, so that the peripheral portion of the semiconductor chip 904 is in an overhanging state. In the aforementioned semiconductor device 900, the holding plate 905 has a role to prevent a deformation of the semiconductor chip 904 by applying its own weight to the semiconductor chip 904. In order to prevent warpage of the semiconductor chip 904, the holding plate 905 needs to cover the overhang portion of the semiconductor chip 904.

SUMMARY OF THE INVENTION

However, Patent Document 1 has the following problems.

As shown in FIG. 17, in the process of providing a wire 906, a capillary 907 that holds the wire 906 needs to be moved to the holding plate 905 side (reverse operation) in order to form a loop of the wire 906. At this time, the path of the capillary 907 and the wire 906 is the one as shown by a solid line A of FIG. 17.

For this reason, there is a problem that the capillary 907 or the wire 906 interferes with the holding plate 905.

According to an exemplary aspect of the present invention, a semiconductor device includes a first semiconductor chip, a supporting body that is disposed below the first semiconductor chip and supports the first semiconductor chip; a spacer fixed onto the first semiconductor chip, and a connected portion that is located below the first semiconductor chip and electrically connected to the first semiconductor chip with a wire, in which at least a part of the peripheral portion of the first semiconductor chip is an overhang portion that projects more laterally than the peripheral portion of the supporting body, a covering portion that covers a part of the upper surface of the overhang portion is formed in the spacer, the wire is connected to a region, which is lateral to the outermost periphery of the covering portion of the spacer and is not covered with the covering portion of the spacer, of the upper surface of the overhang portion, and a height of an apex of the wire, which is set when a position of the upper surface of the first semiconductor chip is defined as a reference, is greater than the height from the above-described reference of at least a portion in the outermost periphery of the covering portion of the spacer, the portion having the wire arranged at its lateral side.

In the exemplary aspect of the present invention, the height of the apex of the wire is greater than the height of at least a portion in the outermost periphery of the covering portion of the spacer, the portion having the wire arranged at its lateral side.

This can prevent, when the wire is provided, a capillary or the wire from interfering with the covering portion that covers the overhang portion of the spacer. Accordingly, the overhang portion can be connected to the connected portion with the wire reliably.

Here, when the semiconductor device is viewed in planar fashion from the upper surface side of the first semiconductor chip, the portion in the outermost periphery of the covering portion of the spacer, the portion having the wire arranged at its lateral side, may be a region including a portion where an extended line which is a straight line connecting a connection point between the first semiconductor chip and the wire and a connection point between the connected portion and the wire comes into contact with the outermost periphery of the covering portion.

Note that, generally, multiple wires are arranged along at least one side of the first semiconductor chip, and therefore, of the outermost periphery of the covering portion of the spacer, at least the height of one side of the first semiconductor chip along the side, on which the wires are provided, only needs to be lower than the apex of the wire.

According to the present invention, a semiconductor device capable of reliably connecting an overhang portion to a connected portion with a wire, is provided.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
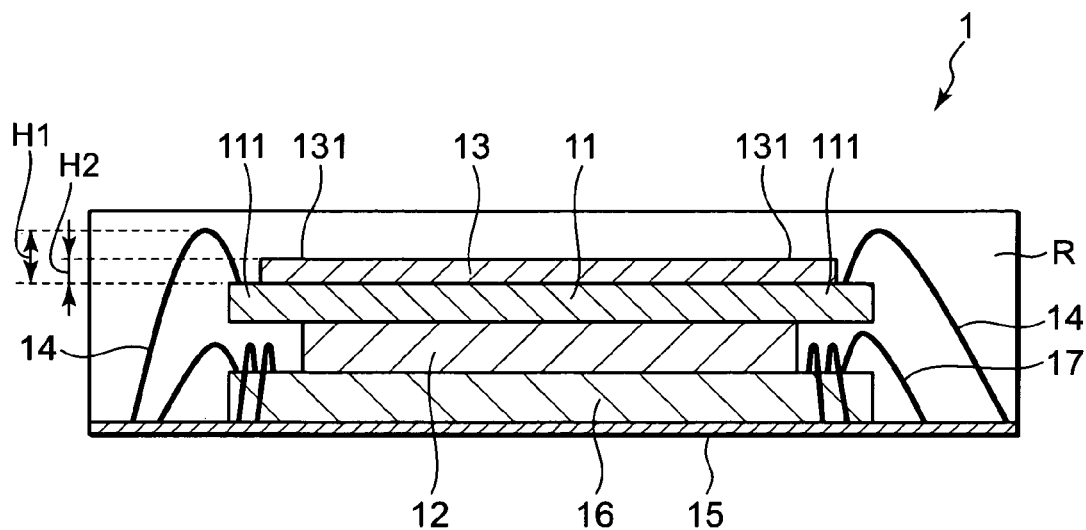
FIG. 1 is a cross-sectional view showing a semiconductor device according to a first exemplary embodiment of the present invention.

FIG. 1 shows an overview of a semiconductor device 1 of an exemplary embodiment.

The semiconductor device 1 of this exemplary embodiment includes a first semiconductor chip 11, a supporting body 12 that is disposed below the first semiconductor chip 11 and supports the first semiconductor chip 11, a spacer 13 fixed onto the first semiconductor chip 11, and a connected portion (substrate 15) that is located below the first semiconductor chip 11 and electrically connected to the first semiconductor chip 11 with a wire 14.

At least a part of the peripheral portion of the first semiconductor chip 11 is an overhang portion 111 that projects more laterally than the peripheral portion of the supporting body 12.

A covering portion 131 that covers a part of the upper surface of the overhang portion 111 is formed in the spacer 13.

The wire 14 is connected to a region, which is lateral to the outermost periphery of the covering portion 131 of the spacer 13 and is not covered with the covering portion 131 of the spacer 13, of the upper surface of the overhang portion 111.

A height H1 of the apex of the wire 14, which is set when the upper surface of the first semiconductor chip 11 is defined as a reference, is greater than a height H2 from the above-described reference of at least a portion in the outermost periphery of the covering portion 131 of the spacer 13, the portion having the wire 14 arranged at its lateral side.

Here, FIG. 1 is a cross-sectional view that is perpendicular to the upper surface of the first semiconductor chip 11 and passes through a connection point between the first semiconductor chip 11 and the wire 14 as well as a connection point between the substrate 15 and the wire 14.

Figure 2:
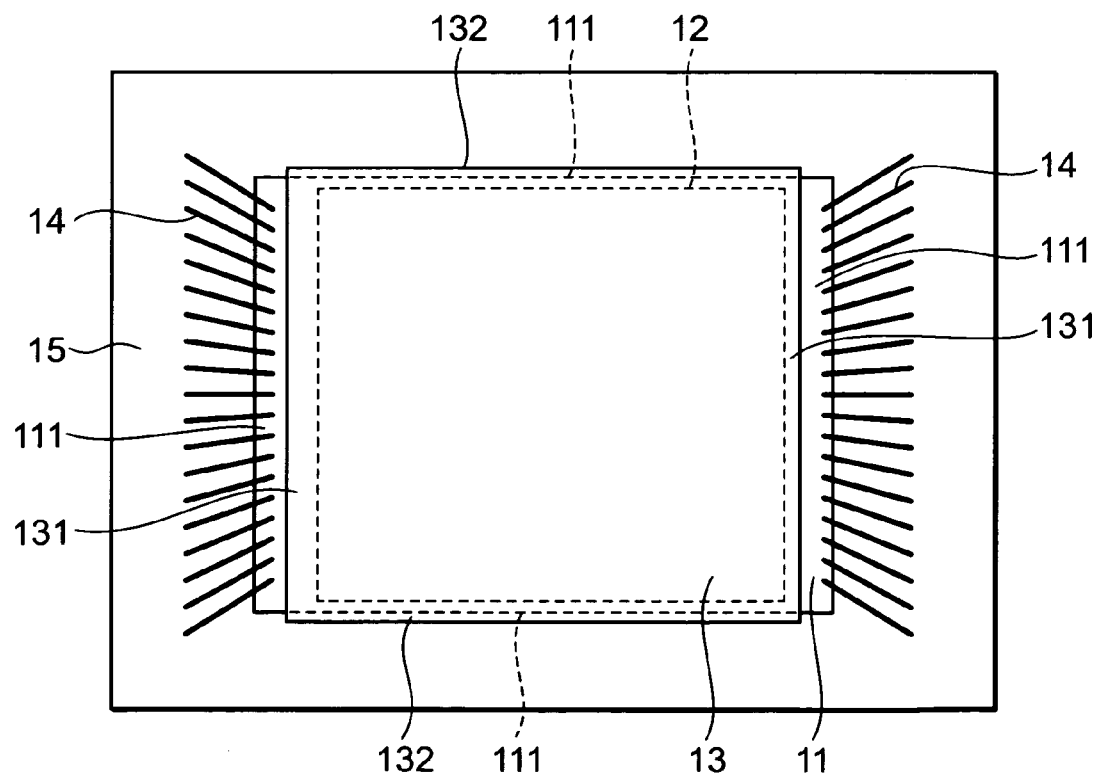
FIG. 2 is a plan view showing the semiconductor device according to the first exemplary embodiment of the present invention.

Next, with reference to FIG. 1 and FIG. 2, the semiconductor device 1 of this embodiment will be described in detail.

The semiconductor device 1 includes a second semiconductor chip 16 and a wire 17, in addition to the first semiconductor chip 11, the supporting body 12, the spacer 13, the wire 14, and the connected portion 15 described above.

The connected portion 15 is a substrate in this exemplary embodiment, and the second semiconductor chip 16, the supporting body 12, the first semiconductor chip 11, and the spacer 13 are stacked on the substrate 15 in this order.

Here, the substrate 15 is an interposer, a flexible wiring substrate, or the like.

The second semiconductor chip 16 is arranged directly on the substrate 15, and is a rectangular shape in plane when viewed from the substrate surface side of the substrate 15.

The peripheral portion (portion of the second semiconductor chip 16, that projects more than the supporting body 12) of the upper surface of the second semiconductor chip 16 is connected to the substrate 15 with the wire 17 (e.g., gold wire).

The supporting body 12 is arranged directly on the second semiconductor chip 16.

The supporting body 12 is a plate material made of silicon, for example, and is bonded to the upper surface of the second semiconductor chip 16 with an adhesive or the like.

In a plane view from the substrate surface side of the substrate 15, the supporting body 12 is in a rectangular shape in plane, and the size of the plane of the supporting body 12 is smaller than the size of the plane of the second semiconductor chip 16. The peripheral portion of the second semiconductor chip 16 projects more laterally (in the direction along the substrate surface of the substrate 15) than the peripheral portion of the supporting body 12. In other words, each side of the second semiconductor chip 16 projects more laterally than each side of the supporting body 12.

To the projecting portion of the second semiconductor chip 16, the wire 17 described above is connected.

On the supporting body 12, the first semiconductor chip 11 is disposed. The first semiconductor chip 11 is bonded onto the supporting body 12 with an adhesive or the like.

The thickness of the first semiconductor chip 11 is preferably not greater than 200 μm.

In a plane view from the substrate surface side of the substrate 15, the first semiconductor chip 11 is a rectangular shape in plane, and the size of the plane of the first semiconductor chip 11 is larger than the size of the plane of the supporting body 12. At least a part of the peripheral portion of the first semiconductor chip 11 projects more laterally (in the direction along the substrate surface of the substrate 15) than the peripheral portion of the supporting body 12. In this exemplary embodiment, the entire circumference of the peripheral portion of the first semiconductor chip 11 projects more laterally than the peripheral portion of the supporting body 12. In other words, each side of the first semiconductor chip 11 projects lateral to each side of the supporting body 12.

Moreover, in a plane view from the substrate surface side of the substrate 15, the size of the plane of the first semiconductor chip 11 is the same as the size of the plane of the second semiconductor chip 16.

Accordingly, each side constituting the peripheral portion of the first semiconductor chip 11 serves as one of four overhang portions 111, and a gap is formed between the overhang portions 111 and the peripheral portion of the second semiconductor chip 16.

The wire 14 is connected to the leading end portion in the projecting direction of the two opposing overhang portions 111 among the four overhang portions 111.

In this exemplary embodiment, the four overhang portions 111 are formed in the first semiconductor chip 11, and the four overhang portions 111 constitute a rectangular frame.

In the upper surface of the aforementioned first semiconductor chip 11, the spacer 13 is disposed.

The spacer 13 is a plate material made of silicon, for example. The spacer 13 is preferably composed of a member that shields an electromagnetic wave. Furthermore, the spacer 13 is preferably made of metal.

The spacer 13 is a tabular plate having a uniform thickness from the peripheral portion to the center portion thereof. The thickness of the spacer 13 is preferably not greater than 200

μm, for example. In particular, the thickness not greater than 100 μm is especially preferable.

The aforementioned spacer 13 is a rectangular shape in plane in a plane view from the substrate surface side of the substrate 15, and the spacer 13 is bonded onto the upper surface of the first semiconductor chip 11 with an adhesive or the like.

A part of the peripheral portion of the first semiconductor chip 11 projects more laterally than the peripheral portion of the spacer 13. In this exemplary embodiment, two opposing sides among the four sides constituting the peripheral portion of the first semiconductor chip 11 project more laterally than the two sides constituting the peripheral portion of the spacer 13. Note that, among the four sides constituting the peripheral portion of the first semiconductor chip 11, the other two opposing sides do not project from the other two sides constituting the peripheral portion of the spacer 13.

The peripheral portion of the spacer 13 is the covering portion that covers the overhang portion 111 of the first semiconductor chip 11. Two opposing sides among the four sides constituting the peripheral portion of the spacer 13 serve as covering portions 131 that cover a part of the overhang portions 111, i.e., the proximal sides in the projecting directions of the overhang portions 111. The leading end portion in the projecting direction of the overhang portion 111 projects more laterally than that of the covering portion 131. The covering portion 131 covers not less than ⅓, preferably not less than ¾, of the projection dimension of the overhang portion 111 projecting from the supporting body 12. Furthermore, the spacer 13 covers not less than ⅔, preferably not less than ¾, of the upper surface of the first semiconductor chip 11.

Note that, among the four sides constituting the peripheral portion of the spacer 13, the other two opposing sides serve as covering portions 132 that cover the whole surface of the overhang portions 111. The covering portion 132 projects more laterally than the overhang portion 111.

In this exemplary embodiment, the sides of the spacer 13 are located in the upper surface of the sides of the overhang portion 111 having a rectangular frame-like shape, respectively.

The wire 14 electrically connects the first semiconductor chip 11 to the substrate 15, and is a gold wire, for example.

The wires 14 are connected to regions which are lateral to the outermost peripheries of the covering portions 131 of the spacer 13 and are not covered with the covering portions 131 of the spacer 13 in the upper surfaces of the overhang portions 111, i.e., the leading end portions in the projecting directions of the overhang portions 111 in this exemplary embodiment.

Here, the multiple wires 14 are provided, and are arranged at a predetermined interval along the two opposing sides of the first semiconductor chip 11.

Moreover, the height H1 (maximum height of the wire 14) of the apex of the wire 14 from the upper surface of the first semiconductor chip 11 as a reference is greater than the height H2 of a portion of the spacer 13 from the above-described reference, the portion being located in the outermost periphery of the covering portion 131 of the spacer 13 and having each of the wires 14 arranged at its lateral side.

Since the wires 14 are arranged at predetermined intervals along the two opposing sides of the first semiconductor chip 11 in this embodiment, the height of one side of the outermost periphery of the covering portion 131 of the spacer 13, the one side being along the side at which the wires 14 of the first semiconductor chip 11 are arranged, only needs to be lower than the height of the apex of the wire 14.

Note that, in this exemplary embodiment, since the spacer 13 is tabular, the apex of the wire 14 is located above the upper surface of the spacer 13.

Here, for example, when the height H1 of the apex of the wire 14 from the upper surface of the first semiconductor chip 11 is assumed to be 100 μm, the thickness H2 of the spacer 13 from the upper surface of the first semiconductor chip 11 is assumed to be 50 μm.

Incidentally, the first semiconductor chip 11, the supporting body 12, the spacer 13, the wire 14, the substrate 15, the second semiconductor chip 16, and the wire 17 of the semiconductor device 1 of this exemplary embodiment are sealed with resin R. In FIG. 1, hatching for the resin R is omitted for the sake of enhanced visibility of the drawing.

According to this exemplary embodiment, the following effects can be obtained.

The spacer 13 is arranged on the first semiconductor chip 11, and the covering portion 131 of the spacer 13 covers a part of the overhang portion 111 of the first semiconductor chip 11. Since the upper surface of the first semiconductor chip 11 is fixed to the spacer 13, the overhang portion 111 is pulled upward from the upper surface side by the covering portion 131 of the spacer 13. As a result, the overhang portion 111 of the first semiconductor chip 11 can be prevented from being bent downward, and thereby the warpage of the first semiconductor chip 11 can be prevented.

In addition, in this exemplary embodiment, the height H1 of the apex of the wire 14, the apex being at the maximum height position of the wire 14, is greater than the height H2 of the covering portion 131 of the spacer 13.

By forming the aforementioned wire 14, the wire 14 or the capillary for holding the wire 14 can be prevented from interfering with the spacer 13 at the time of providing the wire 14.

Figure 3:
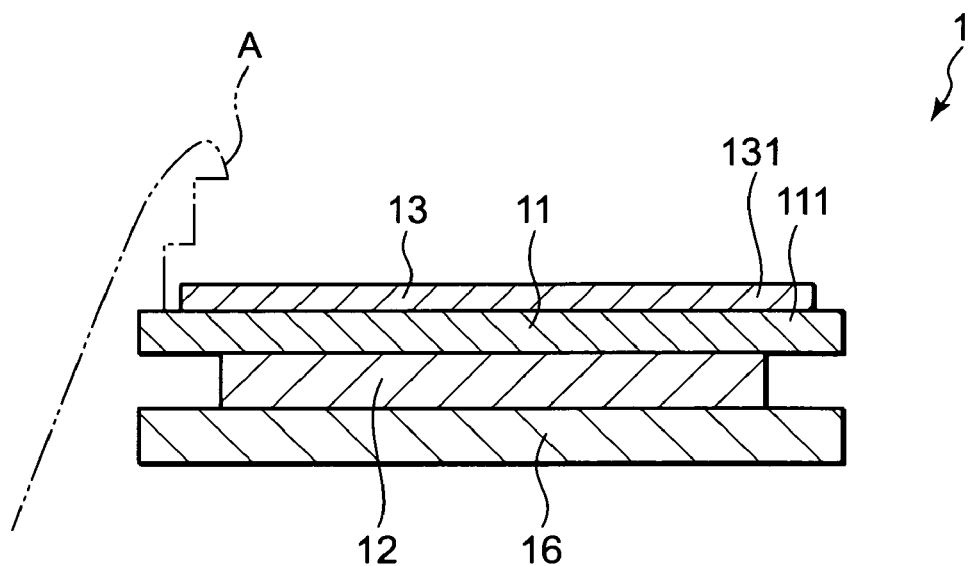
FIG. 3 is a view illustrating the path of a wire and a capillary in the first exemplary embodiment of the present invention.

Specifically, as shown in FIG. 3, at the time of providing the wire 14, the capillary and the wire 14 draw a path as shown by the dashed-dotted line A. In this case, neither the capillary nor the wire 14 interferes with the spacer 13.

Figure 18:
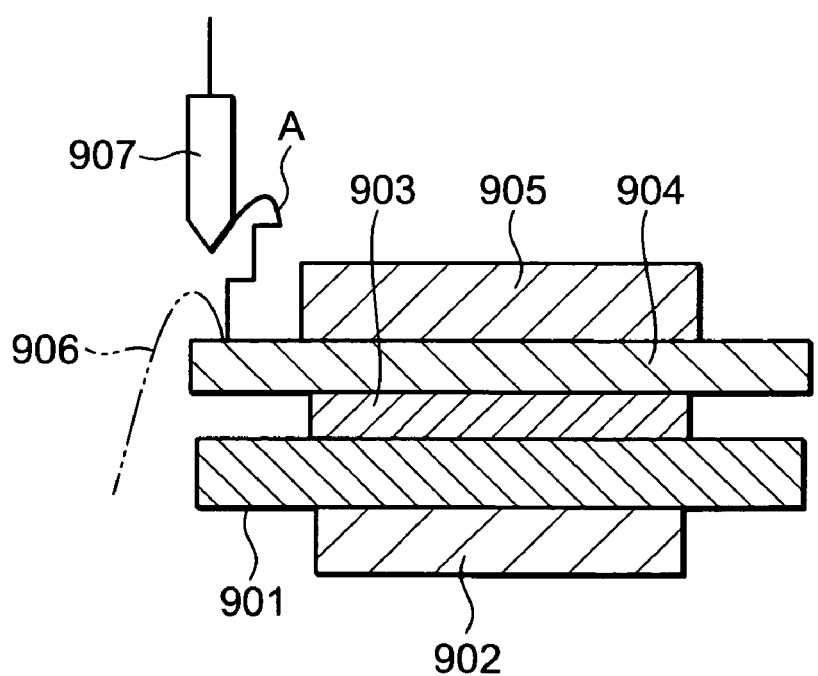
FIG. 18 is a view showing a modification of the semiconductor device of the related art.

On the other hand, as described above, in the semiconductor device 900 having the existing configuration, the capillary or the wire 906 interferes with the holding plate 905. In the existing semiconductor device 900, in order to prevent the interference between the capillary or the wire 906 and the holding plate 905, an end portion of the holding plate 905 may be removed as shown in FIG. 18. However, in this case, the overhang portion cannot be covered with the holding plate 905, so that it may be difficult to prevent the warpage of the semiconductor chip 904.

In this exemplary embodiment, the overhang portion 111 of the first semiconductor chip 11 is covered with the covering portion 131 of the spacer 13, and at the same time the height position of the apex of the wire 14 is set greater than the height (the overall height of the covering portion 131) of at least a portion in the outermost periphery of the covering portion 131 of the spacer 13, the portion having the wire 14 arranged at its lateral side, so that the warpage of the first semiconductor chip 11 can be prevented.

In addition, in this exemplary embodiment, the thickness of the spacer 13 is set to not greater than 200 μm, thus providing a very thin spacer. The thickness of the semiconductor device 1 depends on the height of the wire 14. However, by thinning the thickness of the spacer 13, the semiconductor device 1 can be thinner.

Additionally, in this exemplary embodiment, as the spacer 13, a tabular one is used. The use of the spacer 13 having such a shape eliminates the need for specially processing the spacer 13, thereby not leading to the complicated manufacturing process of the semiconductor device 1.

Further, in this exemplary embodiment, the thickness of the first semiconductor chip 11 is set to not greater than 200 μm, so that the first semiconductor chip 11 is thin. In the first semiconductor chip 11 having such a thin thickness, warpage is likely to occur in the overhang portion 111. However, since the overhang portion 111 of the first semiconductor chip 11 is covered with the covering portion 131, the warpage of the overhang portion 111 can be prevented even if the first semiconductor chip 11 having a thin thickness is used.

In particular, in this exemplary embodiment, since the covering portion 131 of the spacer 13 covers not less than ⅓ of the projection dimension of the overhang portion 111, the warpage of the overhang portion 111 can be prevented more reliably.

In addition, since the spacer 13 covers not less than ⅔ of the upper surface of the first semiconductor chip 11, the warpage across the first semiconductor chip 11 can also be prevented.

Moreover, in this exemplary embodiment, the connected portion to which the first semiconductor chip 11 is connected is the substrate 15, so that this exemplary embodiment can be applied even to the case where there are a great number of the wires 14

In other words, in the case where the connected portion is a lead frame instead of the substrate 15, the lead frame needs to be provided according to the number of the wires 14. However, there is a limit to the number of the lead frames which can be installed. On the other hand, the use of the substrate 15 allows the first semiconductor chip 11 to be connected to the substrate 15 with a greater number of the wires 14.

Further, in this exemplary embodiment, the spacer 13 is a plate material made of silicon, and the spacer 13 is provided so as to cover the first semiconductor chip 11 and the second semiconductor chip 16 of the semiconductor device 1. Accordingly, the first semiconductor chip 11 and the second semiconductor chip 16 can be shielded against an electromagnetic wave.

Furthermore, in this exemplary embodiment, the first semiconductor chip 11 is configured to be sandwiched between the spacer 13 and the supporting body 12. By employing such a structure, the first semiconductor chip 11 is sandwiched between the upper and lower sides. In bonding the wire 14 and the first semiconductor chip 11 together, an ultrasonic wave may be applied to the wire 14. At this time, the second semiconductor chip 11 can be prevented from being bent due to the vibration of the ultrasonic wave.

Accordingly, the bonding failure of the wire 14 can be prevented.

Second Exemplary Embodiment

A second exemplary embodiment of the present invention will be described with reference to FIG. 4.

In the first exemplary embodiment, the spacer 13 is tabular. On the other hand, in this exemplary embodiment, a spacer 23 has a step portion 230 formed in the peripheral portion thereof. Other than the shape of the spacer, a semiconductor device 2 of this embodiment is the same as the semiconductor device 1 of the first exemplary embodiment.

Figure 4:
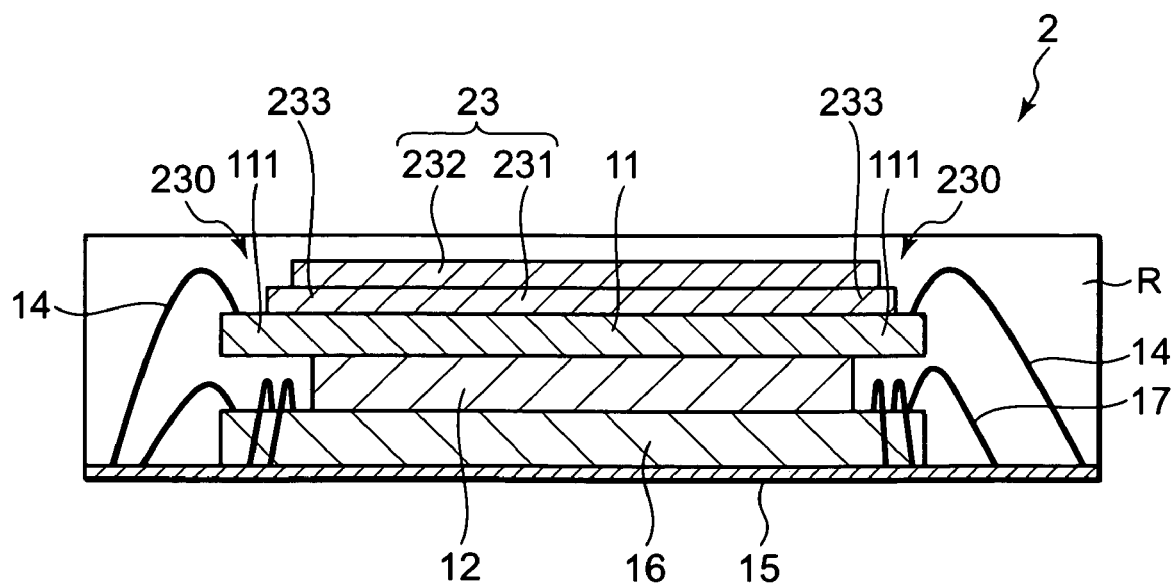
FIG. 4 is a cross-sectional view showing a semiconductor device according to a second exemplary embodiment of the present invention.

Note that, FIG. 4 is a cross-sectional view that is perpendicular to the upper surface of a first semiconductor chip 11 and passes through a connection point between the first semiconductor chip 11 and a wire 14 as well as a connection point between a substrate 15 and the wire 14.

The spacer 23 includes a first spacer portion 231 located directly on the first semiconductor chip 11, and a second spacer portion 232 on the first spacer portion 231. In this exemplary embodiment, the first spacer portion 231 and the second spacer portion 232 are separately formed, and the second spacer portion 232 is fixed onto the first spacer portion 231.

The first spacer portion 231 and the second spacer portion 232 are each in a rectangular shape in plane when viewed in planar fashion from the substrate surface side of the substrate 15.

The first spacer portion 231 is fixed to the upper surface of the first semiconductor chip 11 with an adhesive or the like. The first spacer portion 231 is tabular, and the height dimension from the upper surface of the first semiconductor chip 11 of the first spacer portion 231 is lower than the height dimension of the apex of the wire 14.

The peripheral portion (each side of the first spacer portion 231, in this embodiment) of the first spacer portion 231 is located on the overhang portion 111.

Although the second spacer portion 232 is tabular and rectangular plane-shaped, the plane shape thereof is smaller than that of the first spacer portion 231. Accordingly, at least a part of the peripheral portion of the first spacer portion 231 projects more laterally than at least a part of the peripheral portion of the second spacer portion 232. In this exemplary embodiment, each of one pair of opposing sides of the first spacer portion 231 projects more laterally than each of one pair of opposing sides of the second spacer portion 232.

Moreover, although not illustrated, when viewed in planar fashion, each of the other pair of opposing sides of the first spacer portion 231 is located at the same position as that of each of the other pair of opposing sides of the second spacer portion 232.

The height dimension from the upper surface of the first semiconductor chip 11 of the second spacer portion 232 is greater than the height dimension of the apex of the wire 14.

The step portion 230 described above is formed of the upper surface of the peripheral portion of the first spacer portion 231 that projects more laterally than the second spacer portion 232, and the leading end surface of the peripheral portion of the second spacer portion 232.

In other words, a pair of the step portions 230 is formed of the pair of sides of the first spacer portion 231 that project more laterally than those of the second spacer portion 232, and the pair of sides of the second spacer portion 232.

The step portion 230 is located above the overhang portions 111, and the two sides of the second spacer portion 232 constituting the step portion 230 cover the overhang portions 111, respectively.

Accordingly, in this exemplary embodiment, a covering portion 233 is formed of a part of the peripheral portion of the first spacer portion 231, and a part of the peripheral portion of the second spacer portion 232.

The wire 14 is arranged adjacent to the lateral side of the step portion 230. Accordingly, the apex of the wire 14 is higher than the height position of a portion lateral to the wire 14 of the outermost periphery of the covering portion 233 of the spacer 23, i.e., the height position of the outermost periphery of the first spacer portion 231 in this embodiment.

Figure 5:
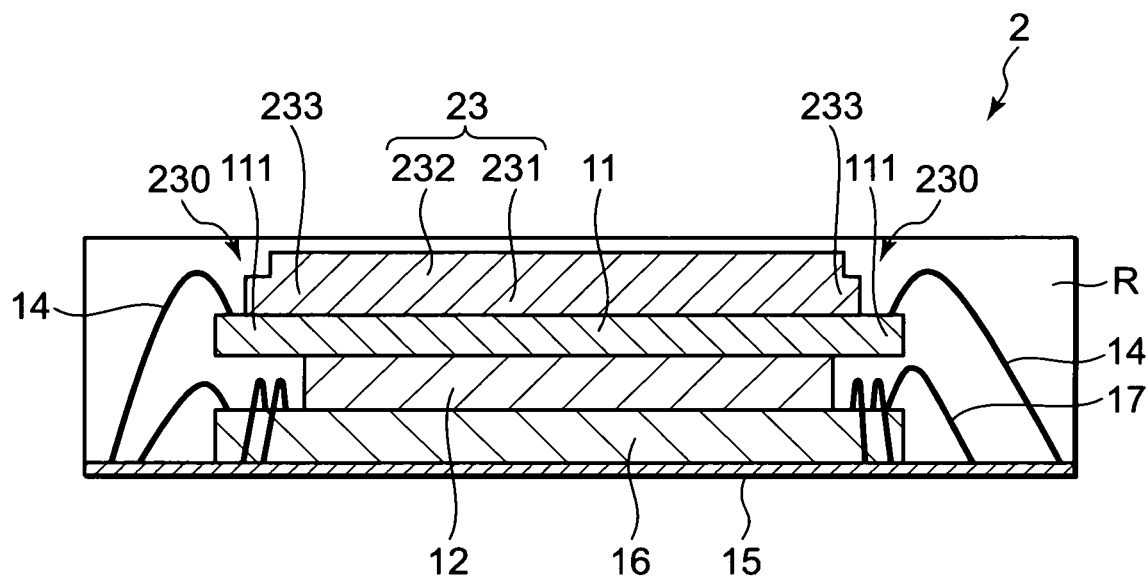
FIG. 5 is a cross-sectional view showing a modification of the semiconductor device according to the second exemplary embodiment of the present invention.

Note that, the first spacer portion 231 and the second spacer portion 232 are separately formed in this exemplary embodiment. However, without being limited thereto, as shown in FIG. 5, the first spacer portion 231 and the second spacer portion 232 may be integrally formed.

Moreover, as in the first exemplary embodiment, the covering portion 233 covers not less than ⅓ of the projection dimension of the overhang portion 111, while the spacer 23 covers not less than ⅔ of the upper surface of the first semiconductor chip 11. Furthermore, the maximum thickness (i.e., a sum of the thickness of the first spacer portion 231 and the thickness of the second spacer portion 232) of the spacer 23 is not greater than 200 μm.

According to the aforementioned second exemplary embodiment, the same effects as those in the first exemplary embodiment can be obtained, and additionally, the following effects can also be obtained.

In this exemplary embodiment, the step portion 230 of the spacer 23 is located above the overhang portion 111, and the peripheral portion of the second spacer portion 232 covers the overhang portion 111.

Accordingly, a part of the overhang portion 111 is covered with the first spacer portion 231 and the second spacer portion 232, and is covered with the thick portion of the spacer 23. Accordingly, the overhang portion 111 can be prevented from being bent downward with the first spacer portion 231 and the second spacer portion 232, reliably.

Figure 6:
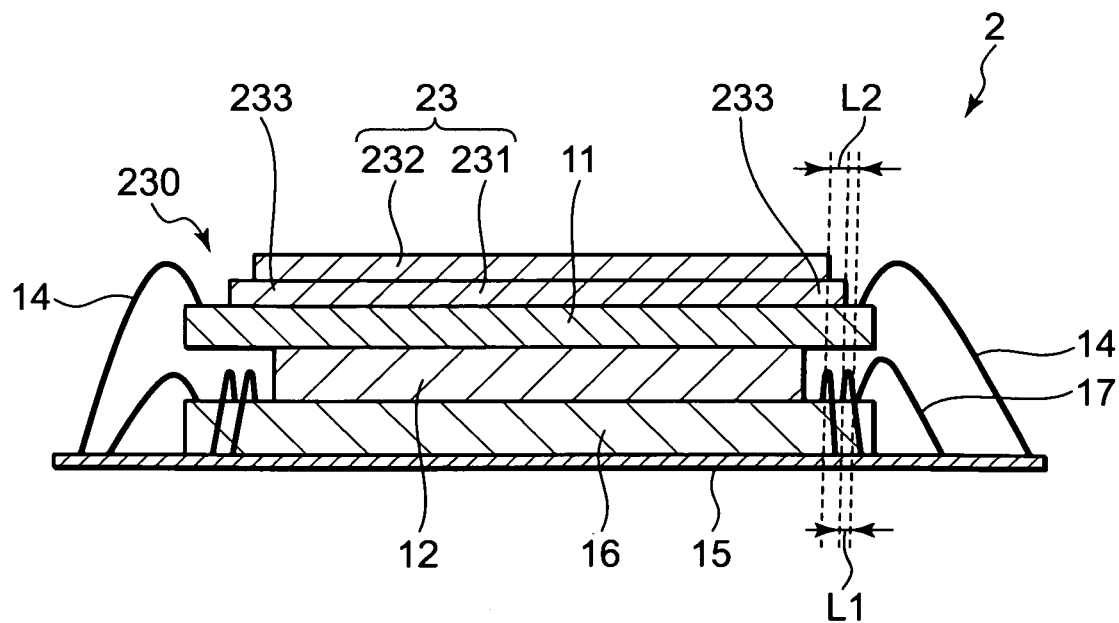
FIG. 6 is a view illustrating the semiconductor device according to the second exemplary embodiment of the present invention.

Moreover, in this exemplary embodiment, the spacer 23 is formed of the first spacer portion 231 and the second spacer portion 232. Thereby, as shown in FIG. 6, in the cross section that is perpendicular to the upper surface of the first semiconductor chip 11 and passes through a connection point between the wire 14 and the first semiconductor chip 11, a distance between a perpendicular line, which passes through the connection point between the wire 14 and the first semiconductor chip 11 and is perpendicular to the upper surface of the first semiconductor chip 11, and the covering portion 233 having the wire 14 arranged at its lateral side, increases from the lower side of the covering portion 233 toward the upper side thereof. In other words, a distance L2 is larger than a distance L1.

In this way, it is possible to secure a movable space of the capillary that becomes gradually wider toward the upper side. This can prevent the capillary from interfering with the spacer 23 even if the leading end portion of the peripheral portion of the spacer 23 and the connection point of the wire 14 are brought closer to each other.

Figure 7:
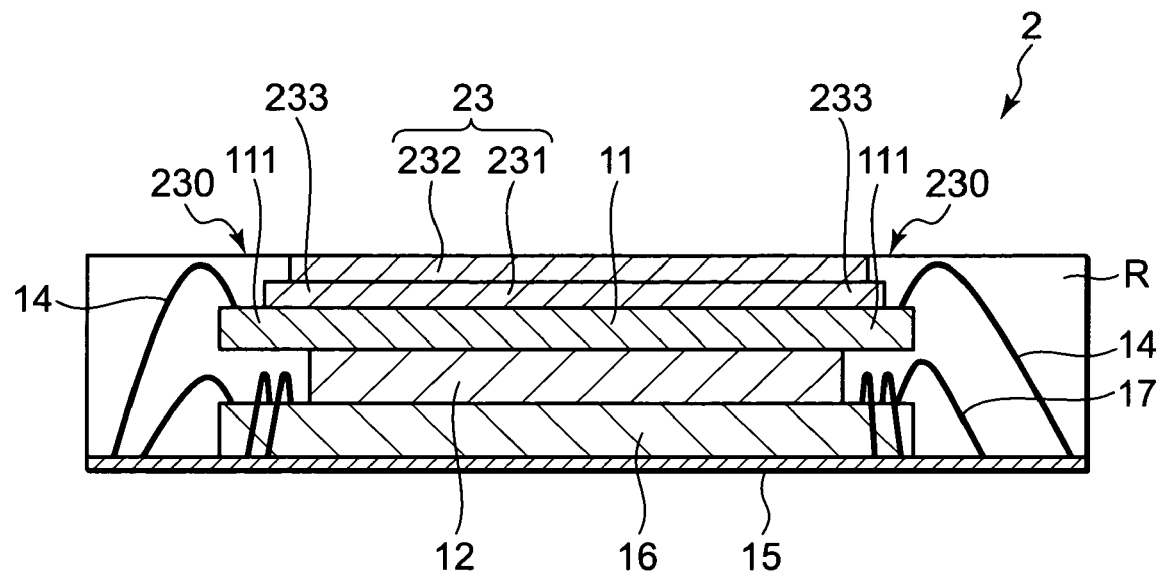
FIG. 7 is a cross-sectional view showing a modification of the semiconductor device according to the second exemplary embodiment.

Incidentally, as shown in FIG. 7, the first semiconductor chip 11, a supporting body 12, the spacer 23, the wire 14, a substrate 15, a second semiconductor chip 16, and a wire 17 of the semiconductor device 2 may be sealed with resin R. In this case, the upper surface of the spacer 23 may be exposed from the resin R to increase the radiation efficiency of the semiconductor device 1.

Figure 8:
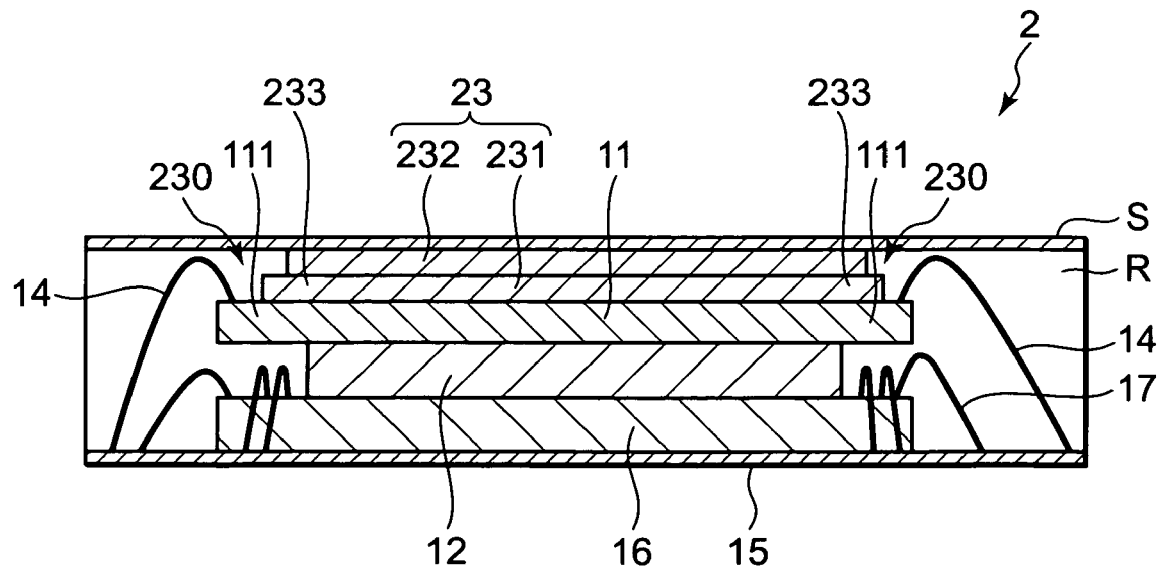
FIG. 8 is a cross-sectional view showing a modification of the semiconductor device according to the second exemplary embodiment.

Furthermore, as shown in FIG. 8, a heat sink S may be disposed above the upper surface, where the spacer 23 is exposed, so as to further increase the radiation efficiency thereof.

Third Exemplary Embodiment

Figure 9:
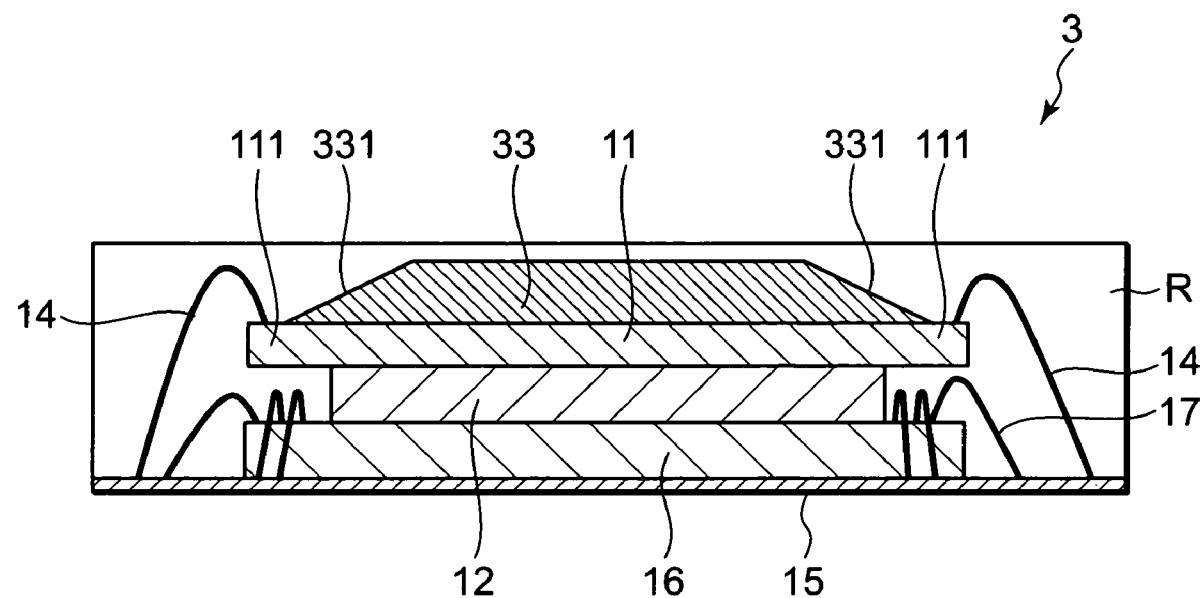
FIG. 9 is a cross-sectional view showing a semiconductor device according to a third exemplary embodiment of the present invention.

With reference to FIG. 9, a semiconductor device 3 of a third exemplary embodiment will be described. FIG. 9 is a cross-sectional view that is perpendicular to the upper surface of a first semiconductor chip 11 and passes through the connection point between the first semiconductor chip 11 and a wire 14 as well as the connection point between a substrate 15 and the wire 14.

In the semiconductor device 3, a spacer 33 has a trapezoidal cross-section.

The structure other than the shape of the spacer is the same as that of each of the above-described embodiments.

The spacer 33 is a rectangular shape in plane when viewed in planar fashion from the substrate surface side of the substrate 15, and the cross section thereof in the direction perpendicular to the substrate surface of the substrate 15 has a trapezoidal shape.

In the spacer 33, the area of the upper surface of the spacer 33 is smaller than the area of the bottom surface, and each side of the bottom surface projects more laterally (outwardly) than each side of the upper surface. Moreover, an inclined surface is formed, which is inclined from each side of the upper surface toward each side (outermost periphery) of the bottom surface.

Since two opposing sides among four sides of the peripheral portion of the spacer 33 serve as a covering portion 331 that covers a part of two opposing overhang portions 111, the inclined surface whose height becomes lower from the upper surface side of the spacer 33 toward the outermost periphery is formed in the covering portion 331.

The wire 14 is arranged lateral to the outermost periphery of the covering portion 331 (lateral to the inclined surface).

Accordingly, from the upper surface of the spacer 33 toward the connection point between the first semiconductor chip 11 and the wire 14, the inclined surface thereof is inclined and the height thereof becomes lower.

Note that the other two opposing sides among the four sides of the peripheral portion of the spacer 33 cover the whole surface of the other two opposing overhang portions 111.

In this exemplary embodiment, the height of the apex of the wire 14 from the upper surface of the first semiconductor chip 11 is also greater than the height of the outermost periphery of the covering portion 331 (here, the sides constituting the bottom surface of the spacer 33).

Moreover, as in the above-described exemplary embodiments, the covering portion 331 covers not less than ⅓ of the projection dimension of the overhang portion 111, while the spacer 33 covers not less than ⅔ of the upper surface of the first semiconductor chip 11. Furthermore, the maximum thickness of the spacer 33 is not greater than 200 um.

According to the above-described exemplary embodiment, the same effects as those in the first embodiment can be obtained, and additionally, the following effects can be obtained.

Usually, the reverse operation moves the capillary to the spacer side in a stepwise fashion. Accordingly, as the capillary goes upward, the movable space needs to be widened.

Figure 10:
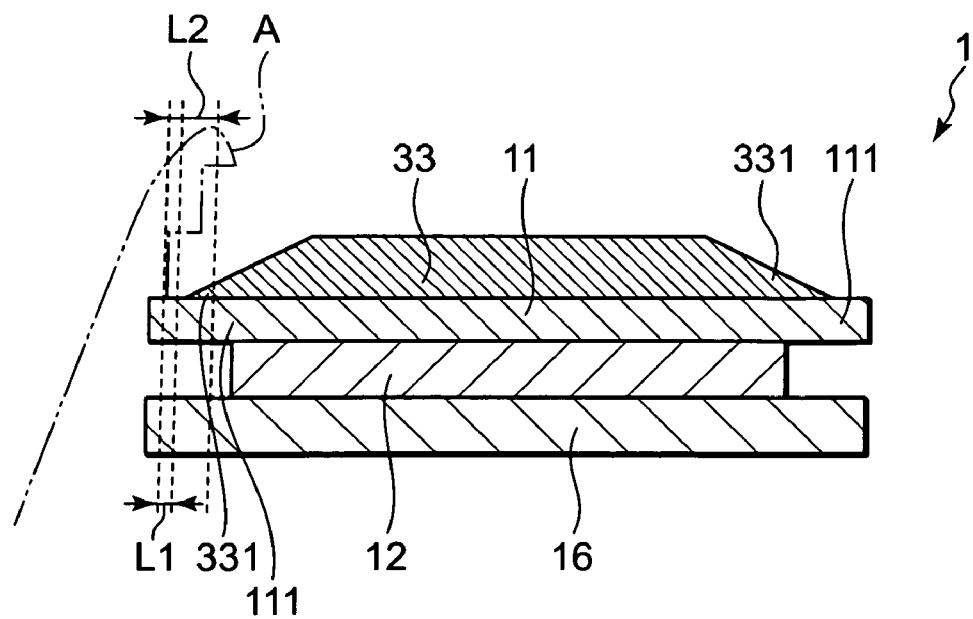
FIG. 10 is a view illustrating the semiconductor device according to the third exemplary embodiment of the present invention.

In this exemplary embodiment, the inclined surface whose height becomes lower toward the connection point between the first semiconductor chip 11 and the wire 14 is formed in the peripheral portion of the spacer 33, so that the spacer 33 has a trapezoidal cross-section. More specifically, in the cross section that is perpendicular to the upper surface of the first semiconductor chip 11 and through a connection point between the wire 14 and the first semiconductor chip 11, a distance between a perpendicular line, which passes through the connection point between the wire 14 and the first semiconductor chip 11 and is perpendicular to the upper surface of the first semiconductor chip 11, and the covering portion 331 having the wire 14 arranged at its lateral side, increases from the lower side of the covering portion 331 toward the upper side thereof. In other words, as shown in FIG. 10, a distance L2 is larger than a distance L1, so that the movable space of the capillary that can be secured becomes gradually wider toward upwards. For this reason, the capillary can be prevented from interfering with the spacer 33 even if the leading end portion of the peripheral portion of the spacer 33 and the connection point of the wire 14 are brought closer to each other.

Accordingly, the area of the covering portion of the overhang portion 111 of the spacer 33 can be secured to be large, and the warpage of the overhang portion 111 can be prevented.

Figure 11:
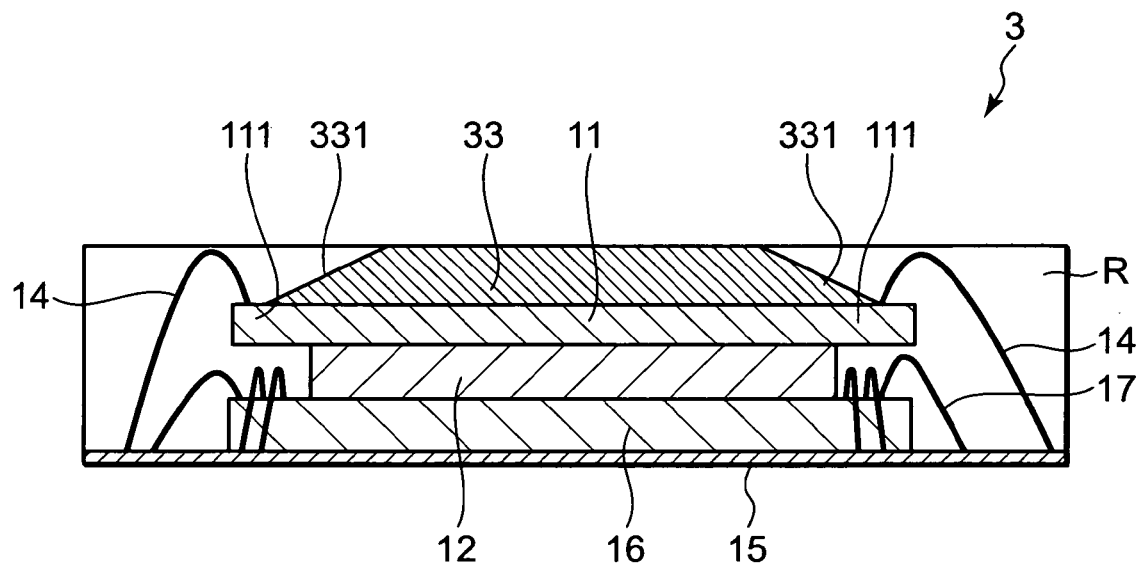
FIG. 11 is a cross-sectional view showing a modification of the semiconductor device according to the third exemplary embodiment.

Note that, as shown in FIG. 11, the first semiconductor chip 11, a supporting body 12, the spacer 33, the wire 14, the substrate 15, a second semiconductor chip 16, and a wire 17 of the semiconductor device 3 may be sealed with resin R. In this case, the upper surface of the spacer 33 may be exposed from the resin R to increase the radiation efficiency of the semiconductor device 1.

Figure 12:
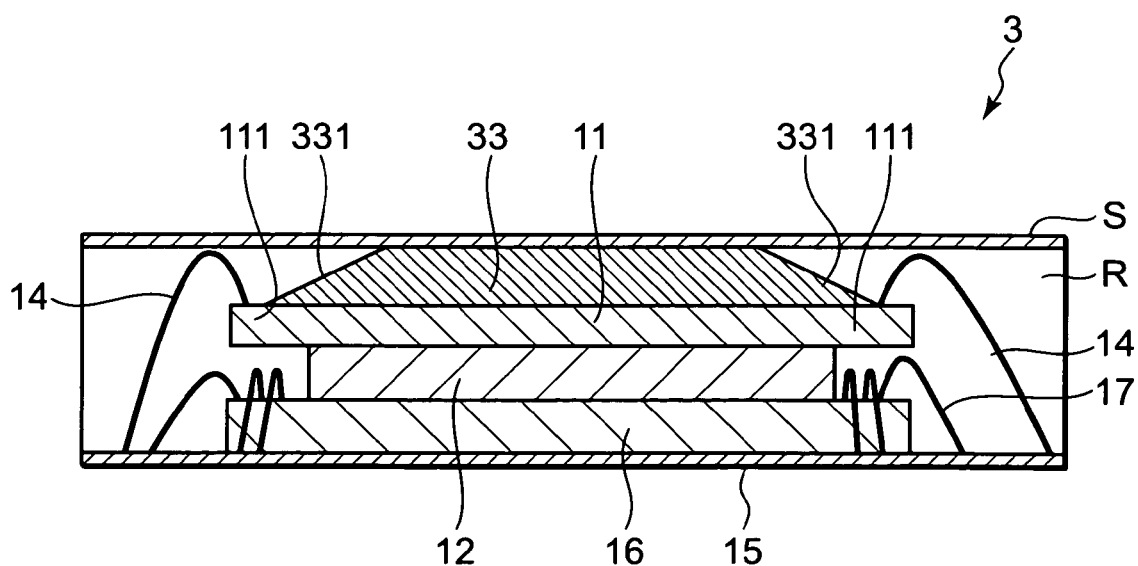
FIG. 12 is a cross-sectional view showing a modification of the semiconductor device according to the third exemplary embodiment.

Furthermore, as shown in FIG. 12, a heat sink S may be disposed above the upper surface, where the spacer 33 is exposed, so as to further increase the radiation efficiency thereof.

Fourth Exemplary Embodiment

Figure 13:
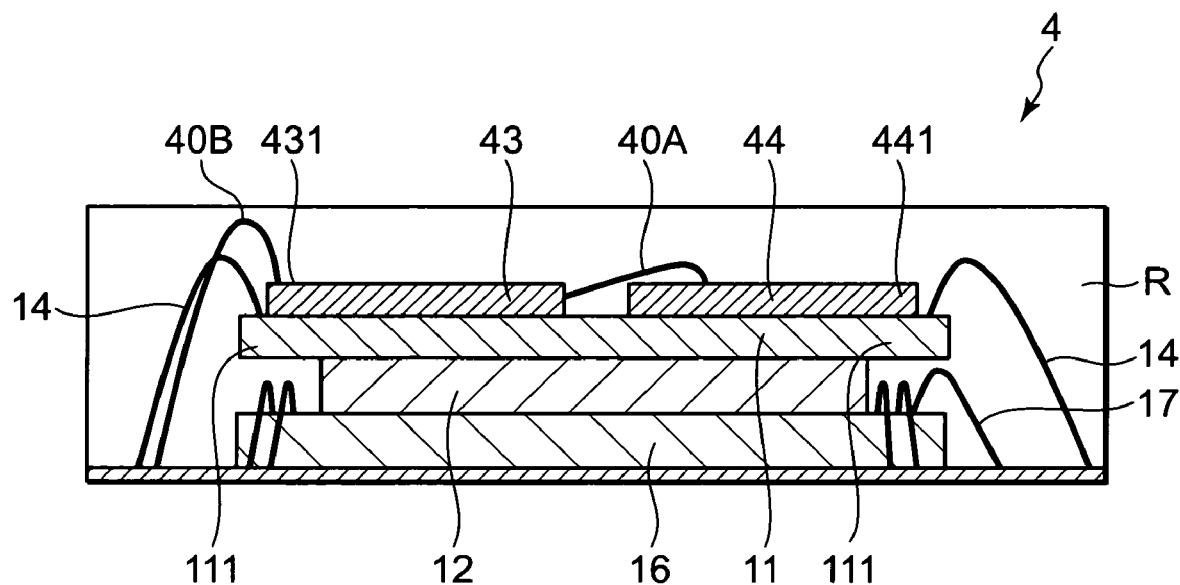
FIG. 13 is a cross-sectional view showing a semiconductor device according to a fourth exemplary embodiment of the present invention.

With reference to FIG. 13, this exemplary embodiment is described. Here, FIG. 13 is a cross-sectional view that is perpendicular to the upper surface of a first semiconductor chip 11 and passes through the connection point between the first semiconductor chip 11 and a wire 14 as well as the connection point between a substrate 15 and the wire 14.

A semiconductor device 4 of this exemplary embodiment includes two spacers 43 and 44 in place of the spacer 13.

In the first exemplary embodiment, the entire circumference of the peripheral portion of the spacer 13 covers the upper surface of the overhang portions 111. In contrast, for the spacers 43 and 44 of this exemplary embodiment, only parts of the peripheral portions thereof cover the upper surface of the overhang portions 111.

The spacers 43 and 44 are spaced apart from each other, and the spacer 44 is a semiconductor chip (third semiconductor chip).

The spacer 44 is a rectangular shape in plane when the substrate 15 is viewed in planar fashion, and the three sides thereof cover the overhang portions 111 to serve as the covering portions. The one side of the spacer 44 located near the center portion side of the upper surface of the first semiconductor chip 11 does not cover the overhang portion 111.

One covering portion among the covering portions of the spacer 44 is a covering portion 441 covering a part of the overhang portion 111, and the wire 14 is arranged lateral to this covering portion 441.

The spacer 44 is in the form of a flat plate whose thickness is uniform from the center portion toward the peripheral portion, and the thickness of the spacer 44 is smaller than the maximum height from the upper surface of the first semiconductor chip 11 of the wire 14 (the height of the apex of the wire 14).

On the other hand, the spacer 43 does not have the function as a semiconductor chip. The spacer 43 is a rectangular shape in plane when the substrate 15 is viewed in planar fashion; and the three sides thereof serve as the covering portions covering the overhang portions 111. The one side of the spacer 43 located near the center portion of the upper surface of the first semiconductor chip 11 does not cover the overhang portion 111.

One covering portion among the covering portions of the spacer 43 is a covering portion 431 covering a part of the overhang portion 111, and the wire 14 is arranged lateral to the covering portion 431.

The spacer 43 is also in the form of a flat plate whose thickness is uniform from the center portion toward the peripheral portion, and the thickness of the spacer 43 is smaller than the maximum height from the upper surface of the first semiconductor chip 11 of the wire 14 (height of the apex of the wire 14).

Note that, the spacer 43 has a function of wiring and the spacer 44 is connected to the substrate 15 via the spacer 43.

Specifically, the spacer 44 and the spacer 43 are connected to each other with a wire 40A, and furthermore the spacer 43 is connected to the substrate 15 with a wire 40B.

Here, specifically, the spacer 43 is a semiconductor wafer, such as a silicon wafer, in which the wiring is formed.

According to this exemplary embodiment, the same effects as those of the first exemplary embodiment can be obtained.

Note that, further, as in the above-described embodiments, the covering portions 431 and 441 cover not less than ⅓ of the projection dimension of the overhang portion 111, while the spacers 43 and 44 cover not less than ⅔ of the upper surface of the first semiconductor chip 11. Furthermore, the maximum thickness of the spacers 43 and 44 is not greater than 200 μm.

Note that the present invention is not limited to the above-described exemplary embodiments, and the modifications, improvements, and the like in the range capable of achieving the object of the present invention are included in the present invention.

The first semiconductor chip 11 is connected to the substrate 15 with the wire 14 in each of the above-described exemplary embodiments, but not limited thereto, and for example, the first semiconductor chip may be connected to a lead frame as the connected portion with a wire.

Figure 14:
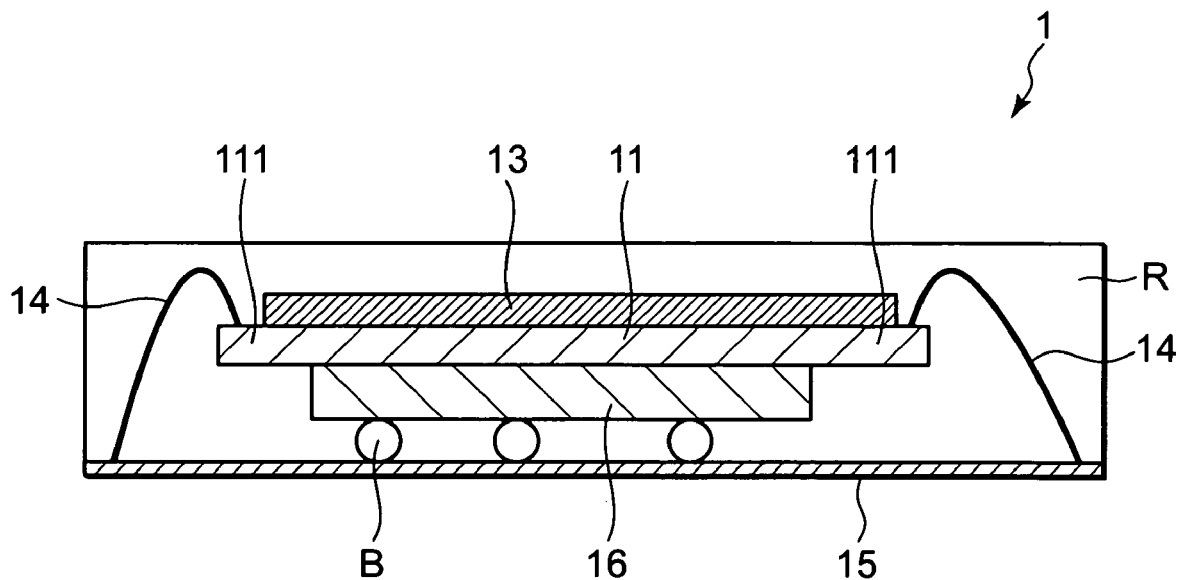
FIG. 14 is a cross-sectional view of a semiconductor device showing a modification of the present invention.

Furthermore, the second semiconductor chip 16 is connected to the substrate 15 with the wire 17 in each of the above-described exemplary embodiments, but not limited thereto, and, as shown in FIG. 14, a bump B may be provided on the rear surface of the second semiconductor chip 16, so that the second semiconductor chip 16 may be connected to the substrate 15 via the bump B. In this case, the second semiconductor chip 16 serves as a supporting body that supports the first semiconductor chip 11.

Moreover, in the second exemplary embodiment, each side of the first spacer portion 231 projects more than each side of the second spacer portion 232 and the step portions 230 are formed in the four sides of the spacer 23, but not limited thereto, and the step portions may be formed only on the sides, each having the wire 14 arranged at its lateral side.

Similarly, also in the third exemplary embodiment, the inclined surface that is inclined from each side of the upper surface of the spacer 33 toward each side (outermost periphery) of the bottom surface is formed, but not limited thereto, and the inclined surfaces may be formed only on two sides, each having the wire 14 arranged at its lateral side.

Furthermore, in each of the above-described exemplary embodiments, the multiple wires 14 are arranged along one side of the first semiconductor chip 11, and the height of one side along the side of the first semiconductor chip 11, on which the wires 14 are provided, of the outermost periphery of the covering portion of the spacer is lower than the apex of the wire 14.

However, not limited thereto, and for example, in the case where the multiple wires are not arranged, the height of at least a portion in the outermost periphery of the covering portion of the spacer, the portion having the wire arranged at its lateral side, may be lower than the apex of the wire.

Figure 15:
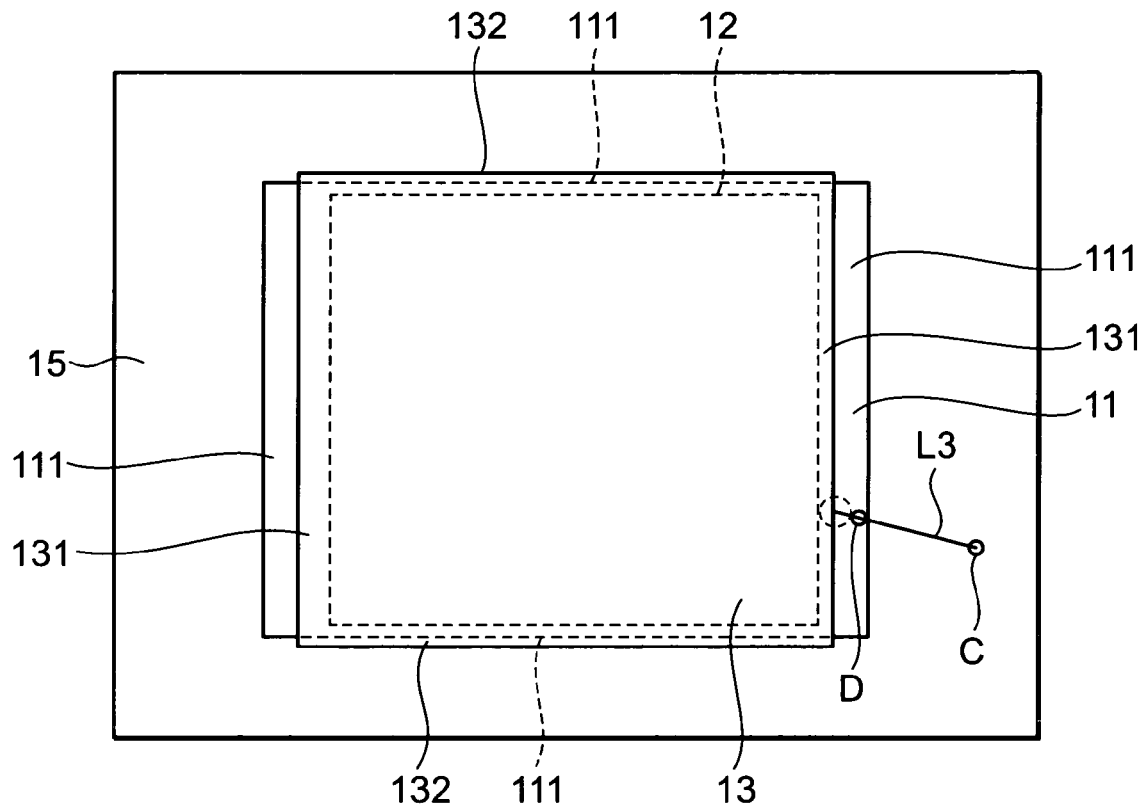
FIG. 15 is a plan view of a semiconductor device relating to a present invention.
Figure 16:
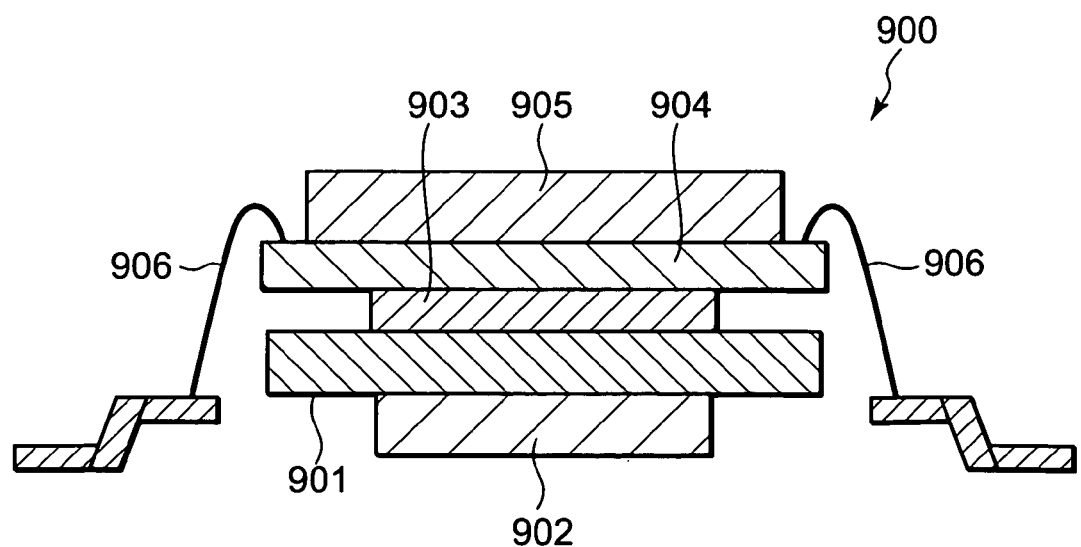
FIG. 16 is a view showing a semiconductor device of a related art.
Figure 17:
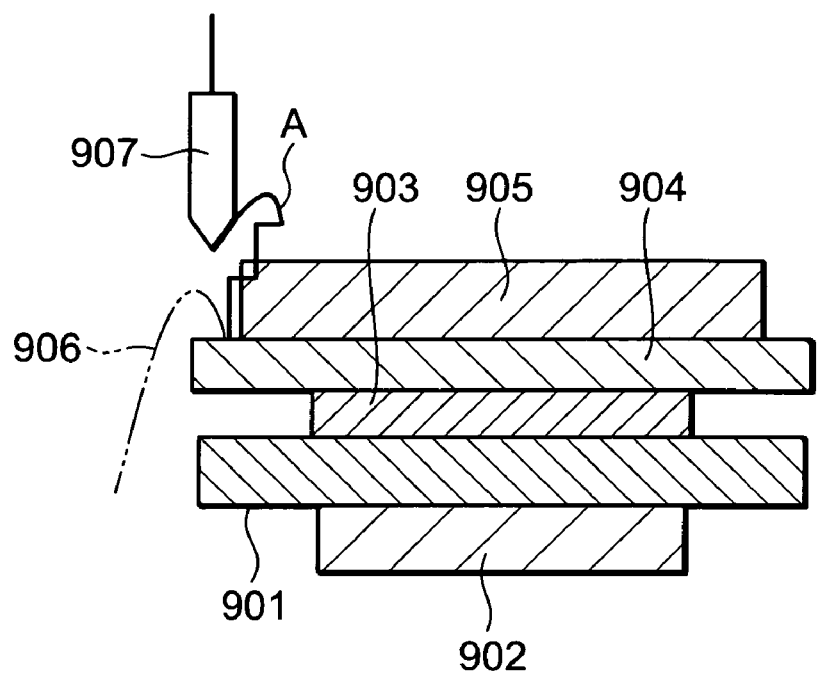
FIG. 17 is a view showing the semiconductor device of the related art.

Here, when the semiconductor device is viewed in planar fashion from the upper surface side of the semiconductor chip as shown in FIG. 15, the portion, having the wire arranged at its lateral side, in the outermost periphery of the covering portion of the spacer may include a portion (portion encircled by a dotted line in FIG. 15) in the outermost periphery of the covering portion that meets with an extended line L3 which is a straight line connecting a connection point D between the semiconductor chip and the wire and a connection point C between the connected portion and the wire, and at the same time it may be within a range, in which the wire and the capillary can carry out the reverse operation (e.g., within a range of at least 0.1 mm from the connection point D, preferably within a range of not less than 0.2 mm from the connection point D). In other words, the height dimension of the portion meeting with the extended line L3 which is the straight line connecting the connection point D between the semiconductor chip and the wire and the connection point C between the connected portion and the wire, as well as the height dimension of the range in which the wire and the capillary carry out the reverse operation need to be lower than the apex of the wire.

Further, it is noted that Applicant's intent is to encompass equivalents of all claim elements, even if amended later during prosecution.

What is claimed is:

1. A semiconductor device, comprising:
    a semiconductor chip;.
    a supporting body which is disposed below the semiconductor chip and supports the semiconductor chip;
    a spacer that is fixed onto the semiconductor chip; and
    a connected portion that is located below the semiconductor chip and electrically connected to the semiconductor chip with a wire, wherein:
        at least a part of a peripheral portion of the semiconductor chip comprises an overhang portion that projects more laterally than a peripheral portion of the supporting body;
        the spacer has a covering portion that covers a part of an upper surface of the overhang portion of the semiconductor chip;
        the wire is connected to a region of the upper surface of the overhanging portion, the region being lateral to an outermost periphery of the covering portion of the spacer and not being covered with the covering portion of the spacer; and
        a height of an apex of the wire from the upper surface of the semiconductor chip as a reference, is greater than a height, from the reference, of at least a portion in the outermost periphery of the covering portion of the spacer, the portion having the wire arranged at its lateral side.

2. The semiconductor device according to claim 1, wherein:
    the spacer is tabular:
    at least a part of the peripheral portion of the spacer comprises the covering portion that covers the overhang portion: and
    the height of the apex of the wire is greater than a height of an upper surface of the spacer from the reference.

3. The semiconductor device according to claim 1, wherein
    in a cross section perpendicular to the upper surface of the semiconductor chip, a distance between the covering portion and a perpendicular line that passes through a connection point between the wire and the semiconductor chip and is perpendicular to the upper surface of the semiconductor chip, increases from a lower side of the covering portion to an upper side thereof.

4. The semiconductor device according to claim 3, wherein the spacer includes:
    a first spacer portion disposed on the semiconductor chip, and a height of the upper surface thereof from the reference being lower than the height of the apex of the wire; and
    a second spacer portion disposed on the first spacer portion;
    at least one part of a peripheral portion of the first spacer portion projects more laterally than a peripheral portion of the second spacer portion and constitutes the covering portion;
    a step portion is formed from the at least one part of the peripheral portion of the first spacer portion and the peripheral portion of the second spacer portion; and
    the wire is arranged at a lateral side of the step portion.

5. The semiconductor device according to claim 4, wherein:
    the peripheral portion of the second spacer portion constituting the step portion is located above the overhang portion of the spacer and constitutes the covering portion together with the peripheral portion of the first spacer portion constituting the step portion.

6. The semiconductor device according to claim 3, wherein:
    an inclined surface that is inclined from an upper surface side of the spacer toward the outermost periphery of the spacer is formed in the covering portion of the spacer; and
    the wire is arranged at a lateral side of the inclined surface.

7. The semiconductor device according to claim 3, wherein:
    the semiconductor device is sealed with a resin; and
    an upper surface of the spacer is exposed from the resin.

8. The semiconductor device according to claim 7, wherein a heat sink is disposed above the spacer.

9. The semiconductor device according to claim 1, further comprising:
    a second semiconductor chip;
    the supporting body being disposed on the second semiconductor chip, wherein:
        at least a part of a peripheral portion of the second semiconductor chip projects more laterally than a peripheral portion of the supporting body; and
        a region of the second semiconductor chip that projects more than the supporting body is wire-connected to the connected portion.

10. The semiconductor device according to claim 1, wherein:
    a leading end portion in a projecting direction of the overhang portion projects more laterally than the covering portion of the spacer;
    the covering portion of the spacer covers at least ⅓ of a projection dimension of the overhang portion projecting from the supporting body; and
    the spacer covers at least ⅔ of the upper surface of the semiconductor chip.

11. The semiconductor device according to claim 1, wherein:
    the spacer and a second semiconductor chip are disposed on the semiconductor chip;
    the spacer is electrically connected to the connected portion; and
    the second semiconductor chip is electrically connected to the connected portion via the spacer.

12. The semiconductor device according to claim 1, wherein:
    a maximum thickness of the spacer is equal to or lower than 200 μm.

13. The semiconductor device according to claim 1, wherein:
    a thickness of the semiconductor chip is equal to or lower than 200 μm.

14. The semiconductor device according to claim 1, wherein
    the connected portion comprises a substrate.

15. A semiconductor device, comprising:
a substrate;
a first semiconductor chip formed on the substrate;
a supporting body formed on the first semiconductor chip;
a second semiconductor chip formed on the supporting body so that a first surface of the second semiconductor chip is attached to the supporting body;
a spacer having a first surface attached to a second surface of the second semiconductor chip, a length of the spacer attached to the second semiconductor chip being greater than a length of the supporting body attached to the second semiconductor chip; and
a wire provided between the substrate and the second surface of the second semiconductor chip,
wherein a distance between an apex of the wire and the substrate is larger than a distance between a second surface of the spacer and the substrate.

16. A semiconductor device, comprising:
a substrate;
a first semiconductor chip formed on the substrate;
a supporting body formed on the first semiconductor chip;
a second semiconductor chip formed on the supporting body so that a first surface of the second semiconductor chip is attached to the supporting body;
a spacer formed on a second surface of the second semiconductor chip, the second surface of the second semiconductor opposing to the first surface of the second semiconductor chip, so that a first surface of the spacer is attached to the second surface of the second semiconductor chip, a length of the spacer attached to the second semiconductor chip being larger than a length of the supporting body attached to the second semiconductor chip, and the spacer having a side wall which is one of sloped and stepped so that a length of the first surface of the spacer becomes shorter than a length of a second surface of the spacer, the first surface of the spacer opposing to the first surface of the spacer; and
a wire provided between the substrate and the second surface of the second semiconductor chip,
wherein a distance between an apex of the wire and the substrate is smaller than a distance between the second surface of the spacer and the substrate.

* * * * *